United States Patent
Nakada

(10) Patent No.: US 11,462,671 B2
(45) Date of Patent: Oct. 4, 2022

(54) MAGNESIUM-BASED THERMOELECTRIC CONVERSION MATERIAL, MAGNESIUM-BASED THERMOELECTRIC CONVERSION ELEMENT, AND METHOD FOR PRODUCING MAGNESIUM-BASED THERMOELECTRIC CONVERSION MATERIAL

(71) Applicant: MITSUBISHI MATERIALS CORPORATION, Tokyo (JP)

(72) Inventor: Yoshinobu Nakada, Saitama (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 16/632,686

(22) PCT Filed: May 11, 2018

(86) PCT No.: PCT/JP2018/018373
§ 371 (c)(1),
(2) Date: Jan. 21, 2020

(87) PCT Pub. No.: WO2019/035253
PCT Pub. Date: Feb. 21, 2019

(65) Prior Publication Data
US 2020/0227610 A1    Jul. 16, 2020

(30) Foreign Application Priority Data
Aug. 15, 2017 (JP) .............................. JP2017-156729

(51) Int. Cl.
*H01L 35/26* (2006.01)
*H01L 35/34* (2006.01)
(Continued)

(52) U.S. Cl.
CPC ........ *H01L 35/26* (2013.01); *C04B 35/58085* (2013.01); *C04B 35/6262* (2013.01);
(Continued)

(58) Field of Classification Search
CPC .................................................. H01L 35/00–34
See application file for complete search history.

(56) References Cited

U.S. PATENT DOCUMENTS 10,468,577 B2 * 11/2019 Nakada .................. H01L 35/32
11,306,002 B2 *  4/2022 Kinge ........................ C01F 5/02
(Continued)

FOREIGN PATENT DOCUMENTS

EP    1433862 A1 *  6/2004  ............. C01B 33/06
EP    3196951 A1     7/2017
(Continued)

OTHER PUBLICATIONS

Ikeda, et al. "Nanostructuring of thermoelectric Mg2Si via a nonequilibrium intermediate state." Small 8. 15 (2012): 2350-2355uring of thermoelectric Mg2Si via a nonequilibrium intermediate state. Small 8. 15 (2012): 2350-2355.*
(Continued)

*Primary Examiner* — Golam Mowla
(74) *Attorney, Agent, or Firm* — Locke Lord LLP; James E. Armstrong, IV; Nicholas J. DiCeglie, Jr.

(57) ABSTRACT

A magnesium-based thermoelectric conversion material made of a sintered compact of a magnesium compound, in which, in a cross section of the sintered compact, a Si-rich metallic phase having a higher Si concentration than in magnesium compound grains is unevenly distributed in a crystal grain boundary between the magnesium compound grains, an area ratio of the Si-rich metallic phase is in a range of 2.5% or more and 10% or less, and a number density of (Continued)

the Si-rich metallic phase having an area of 1 μm² or more is in a range of 1,800/mm² or more and 14,000/mm² or less.

10 Claims, 5 Drawing Sheets

(51) Int. Cl.
*C04B 35/58* (2006.01)
*C04B 35/626* (2006.01)
*C04B 35/645* (2006.01)

(52) U.S. Cl.
CPC ............ *C04B 35/645* (2013.01); *H01L 35/34* (2013.01); *C04B 2235/3891* (2013.01); *C04B 2235/428* (2013.01); *C04B 2235/5427* (2013.01); *C04B 2235/5436* (2013.01); *C04B 2235/85* (2013.01); *C04B 2235/9607* (2013.01)

(56) References Cited

U.S. PATENT DOCUMENTS

| | | | |
|---|---|---|---|
| 2005/0016638 A1* | 1/2005 | Kondoh | C01B 33/06 148/420 |
| 2005/0089435 A1* | 4/2005 | Kondoh | C22C 23/02 148/420 |
| 2006/0057015 A1* | 3/2006 | Kondoh | B22F 1/148 419/53 |
| 2010/0051081 A1* | 3/2010 | Iida | H01L 35/22 423/349 |
| 2010/0092141 A1* | 4/2010 | Li | G02B 6/02328 423/349 |
| 2012/0025130 A1* | 2/2012 | Rowe | H01L 35/16 977/773 |
| 2012/0025154 A1* | 2/2012 | Rowe | C04B 35/62828 977/773 |
| 2012/0097205 A1 | 4/2012 | Iida et al. | |
| 2012/0199797 A1* | 8/2012 | Rowe | H01L 35/16 252/519.4 |
| 2013/0153811 A1* | 6/2013 | Ikeda | H01L 35/16 252/62.3 T |
| 2013/0186448 A1 | 7/2013 | Ranalli et al. | |
| 2017/0069811 A1 | 3/2017 | Kurosaki et al. | |
| 2019/0067548 A1* | 2/2019 | Nakada | C04B 35/645 |

FOREIGN PATENT DOCUMENTS

| | | | | |
|---|---|---|---|---|
| JP | 2003-089804 A | 3/2003 | | |
| JP | 2011-029632 A | 2/2011 | | |
| JP | 2011-249742 A | 12/2011 | | |
| JP | 2012-244001 A | 12/2012 | | |
| JP | 2012-533972 A | 12/2012 | | |
| JP | 2013-077680 A | 4/2013 | | |
| JP | 2017-050505 A | 3/2017 | | |
| JP | 2017152691 A | * | 8/2017 | ............ B22F 3/1039 |
| WO | 2013/047474 A1 | 4/2013 | | |
| WO | 2016/056278 A1 | 4/2016 | | |

OTHER PUBLICATIONS

Yi, et al., "Synthesis and characterization of Mg2Si/Si nanocomposites prepared from MgH2 and silicon, and their thermoelectric properties." Journal of Materials Chemistry 22.47 (2012): 24805-24813.*
Zhang, et al. "Preparation and Thermoelectric Characteristics of SiO2/Mg2Si0.8Sn0.2 Bulk Nanocomposite." Advanced Materials Research. vol. 415. Trans Tech Publications Ltd, 2012.*
International Search Report dated Jul. 24, 2018, issued for PCT/JP2018/018373 and English translation thereof.
Extended European Search Report issued in European Patent Application No. EP 18846157.8, dated Apr. 9, 2021.
Office Action issued in corresponding Japanese Patent Application No. JP 2017-156729, dated May 25, 2021.

* cited by examiner

MAGNESIUM-BASED THERMOELECTRIC CONVERSION MATERIAL, MAGNESIUM-BASED THERMOELECTRIC CONVERSION ELEMENT, AND METHOD FOR PRODUCING MAGNESIUM-BASED THERMOELECTRIC CONVERSION MATERIAL

TECHNICAL FIELD

This invention relates to a magnesium-based thermoelectric conversion material having an excellent thermoelectric conversion efficiency, a magnesium-based thermoelectric conversion element in which the magnesium-based thermoelectric conversion material is used, and a method for producing a magnesium-based thermoelectric conversion material.

Priority is claimed on Japanese Patent Application No. 2017-156729, filed on Aug. 15, 2017, the content of which is incorporated herein by reference.

BACKGROUND ART

A thermoelectric conversion element is an electron element capable of converting heat to electricity and vice versa through the Seebeck effect or the Peltier effect. The Seebeck effect is an effect in which heat energy is converted to electric energy and a phenomenon in which the generation of a temperature difference between both ends of a thermoelectric conversion material generates an electromotive force. Such an electromotive force is determined by the characteristics of the thermoelectric conversion material. In recent years, development of thermoelectric power generation using this effect has been actively underway.

On the other hand, the Peltier effect is an effect in which electric energy is converted to heat energy and a phenomenon in which the generation of a potential difference between electrodes by forming the electrodes or the like at both ends of a thermoelectric conversion material generates a temperature difference between both ends of the thermoelectric conversion material. An element having such an effect is particularly referred to as a Peltier element and used for the cooling of small-sized refrigerators or temperature control of precision equipment, and the like (for example, refer to Patent Document 1).

In recent years, techniques for effectively using heat waste using a thermoelectric power generation device in which the Seebeck effect is used have been drawing attention. For example, there is a proposal that the above-described thermoelectric power generation device in which a Seebeck element is used is attached to a wall surface of a discharge pipe of engine exhaust gas from automobiles or a pipe through which a high-temperature fluid flows in a factory, a plant, or the like, a heat exchange member such as a heat sink is attached to the other surface of the thermoelectric power generation device, and heat is dissipated, thereby converting the heat from this pipe to power and using the power.

As such a thermoelectric power generation device, for example, a thermoelectric power generation device in which tubular thermoelectric power generation devices having a plurality of modulized thermoelectric conversion elements are vertically disposed in one path through which exhaust gas or cooling water flows, and the other path through which cooling water or exhaust gas flows is formed in each of the thermoelectric power generation devices, thereby carrying out thermoelectric power generation using a temperature difference between the inside and outside of a plurality of tubular thermoelectric power generation units disposed side by side is known (for example, refer to Patent Document 2).

A thermoelectric power generation system in which cartridges are formed by mounting a fin in a tubular thermoelectric power generation devices having a plurality of thermoelectric conversion elements each modularized and a plurality of the cartridge-form thermoelectric power generation devices is disposed side by side is also known (for example, refer to Patent Document 3).

CITATION LIST

Patent Literature

[Patent Document 1] Japanese Unexamined Patent Application, First Publication No. 2011-249742

[Patent Document 2] Published Japanese Translation No. 2012-533972 of the PCT International Publication

[Patent Document 3] United States Patent Application, Publication No. 2013/0186448

DISCLOSURE OF INVENTION

Technical Problem

However, thermoelectric conversion materials of the related art which are used for thermoelectric power generation elements as described in Patent Documents 1 to 3 have a problem in that the thermoelectric conversion efficiency is low and a large-area thermoelectric power generation element becomes necessary in order to generate necessary power.

The present invention has been made in consideration of the above-described circumstance, and an object of the present invention is to provide a magnesium-based thermoelectric conversion material having a high thermoelectric conversion efficiency, a magnesium-based thermoelectric conversion element in which the magnesium-based thermoelectric conversion material is used, and a method for producing a magnesium-based thermoelectric conversion material.

Solution to Problem

In order to solve the above-described problem, the present invention employs the following aspects.

A magnesium-based thermoelectric conversion material of an aspect of the present invention (hereinafter, referred to as the magnesium-based thermoelectric conversion material of the present invention) is a magnesium-based thermoelectric conversion material made of a sintered compact of a magnesium compound, in which, in a cross section of the sintered compact, a Si-rich metallic phase having a higher Si concentration than in magnesium compound grains is unevenly distributed in a crystal grain boundary between the magnesium compound grains, an area ratio of the Si-rich metallic phase is in a range of 2.5% or more and 10% or less, and a number density of the Si-rich metallic phase having an area of 1 $\mu m^2$ or more is in a range of 1,800/$mm^2$ or more and 14,000/$mm^2$ or less.

In the magnesium-based thermoelectric conversion material made of the sintered compact of a magnesium compound, MgO is formed and present in the crystal grain boundary of the magnesium compound. This MgO has a low electrical conductivity. Therefore, in an ordinary magnesium-based thermoelectric conversion material, electric resistance becomes high in the crystal grain boundary, and there is a concern that the thermoelectric conversion efficiency of the magnesium-based thermoelectric conversion material may decrease.

In the magnesium-based thermoelectric conversion material of the present invention, the Si-rich metallic phase having a higher Si concentration than in the magnesium compound grains is unevenly distributed in the crystal grain boundary of the magnesium compound. This Si-rich metallic phase has a higher electrical conductivity than MgO, and thus, in the magnesium-based thermoelectric conversion material of the present invention, electric resistance of the crystal grain boundary becomes low compared with in ordinary magnesium-based thermoelectric conversion materials. Therefore, it becomes possible to improve the thermoelectric conversion efficiency of the magnesium-based thermoelectric conversion material.

In addition, in the magnesium-based thermoelectric conversion material of the present invention, the area ratio of the Si-rich metallic phase is set in a range of 2.5% or more and 10% or less, and the number density of the Si-rich metallic phase having an area of 1 μm$^2$ or more is set in a range of 1,800/mm$^2$ or more and 14,000/mm$^2$ or less. Therefore, the Si-rich metallic phase having a relatively high electrical conductivity is uniformly and sufficiently dispersed throughout the entire sintered compact of the magnesium compound, and it becomes possible to improve the thermoelectric conversion efficiency of the magnesium-based thermoelectric conversion material.

Here, in the magnesium-based thermoelectric conversion material of the present invention, the magnesium compound is preferably any of $Mg_2Si$, $Mg_2Si_{1-x}Ge_x$, and $Mg_2Si_{1-y}Sn_y$, wherein: x is in a range satisfying a relationship of $0<x<1$, and y is in a range satisfying a relationship of $0<y<1$.

In this case, the Si-rich metallic phase having a higher Si concentration than in the magnesium compound grains is unevenly distributed in the crystal grain boundary of the sintered compact made of $Mg_2Si$, $Mg_2Si_{1-x}Ge_x$, or $Mg_2Si_{1-y}Sn_y$, whereby it is possible to obtain a magnesium-based thermoelectric conversion material having an excellent thermoelectric conversion efficiency.

In addition, the magnesium-based thermoelectric conversion material of the present invention may include at least one selected from the group consisting of Li, Na, K, B, Al, Ga, In, N, P, As, Sb, Bi, Ag, Cu, and Y as a dopant.

In this case, it is possible to produce a thermoelectric conversion material having a specific semiconductor type (that is, an n-type or a p-type).

A magnesium-based thermoelectric conversion element of the present invention includes the magnesium-based thermoelectric conversion material and electrodes respectively bonded to a surface and another surface opposite to the surface of the magnesium-based thermoelectric conversion material.

The magnesium-based thermoelectric conversion element of the present invention is made of the magnesium-based thermoelectric conversion material, and thus it is possible to obtain a magnesium-based thermoelectric conversion element having a low electric resistance of the crystal grain boundary and an excellent thermoelectric conversion efficiency.

A method for producing a magnesium-based thermoelectric conversion material that is another aspect of the present invention (hereinafter, referred to as the "method for producing a magnesium-based thermoelectric conversion material of the present invention") is a method for producing a magnesium-based thermoelectric conversion material made of a sintered compact of a magnesium compound, the method including a sintering raw material powder formation step of obtaining sintering raw material powder by mixing a silicon oxide into raw material powder of a magnesium compound and a sintering step of forming a sintered compact by pressurizing and heating the sintering raw material powder, in which, in the sintering step, an electric heating method in which the sintering raw material powder is energized while being pressurized using a pair of electrodes is used, and, during sintering, polarities of the pair of electrodes switch at predetermined time intervals.

According to the method for producing a magnesium-based thermoelectric conversion material having this configuration, in the sintering step, the electric heating method in which the sintering raw material powder is energized while being pressurized using the pair of electrodes is used, and, during sintering, polarities of the pair of electrodes switch at predetermined time intervals. Therefore, a difference in a self-heating status is not easily generated between a vicinity of one electrode portion and a vicinity of another electrode portion, and the sintered compact is uniformly sintered. As a result, it is possible to relatively uniformly disperse the Si-rich metallic phase having a higher Si concentration than in the magnesium compound grains throughout the entire sintered compact, and it is possible to obtain a magnesium-based thermoelectric conversion material having an excellent thermoelectric conversion efficiency.

Here, in the method for producing a magnesium-based thermoelectric conversion material of the present invention, in the sintering step, the sintering raw material power is preferably further heated using a heater disposed on an outer circumferential side of the sintering raw material powder.

In this case, the sintering raw material powder is heated not only by electric heating but also by the heater disposed on the outer circumferential side of the sintering raw material powder, and thus it is possible to decrease the temperature difference between an inner circumferential side and the outer circumferential side of a sintering raw material and to more uniformly heat the sintering raw material.

Advantageous Effects of Invention

According to the present invention, it is possible to provide a magnesium-based thermoelectric conversion material having a high thermoelectric conversion efficiency, a magnesium-based thermoelectric conversion element in which the magnesium-based thermoelectric conversion material is used, and a method for producing a magnesium-based thermoelectric conversion material.

BEST MODE FOR CARRYING OUT THE INVENTION

Hereinafter, a magnesium-based thermoelectric conversion material, a magnesium-based thermoelectric conversion element, and a method for producing a magnesium-based thermoelectric conversion material that are an embodiment of the present invention will be described with reference to the accompanying drawings. Individual embodiments described below are specific description for the better understanding of the gist of the invention and do not limit the present invention unless particularly otherwise described. In addition, the drawings to be used in the following description, in some cases, in order to make the characteristic of the present invention easily understandable, show a portion that serves as a main portion in an enlarged manner for convenience, and the dimensional ratios and the like of individual configurational elements are not always the same as the actual dimensional ratios and the like.

Figure 1:
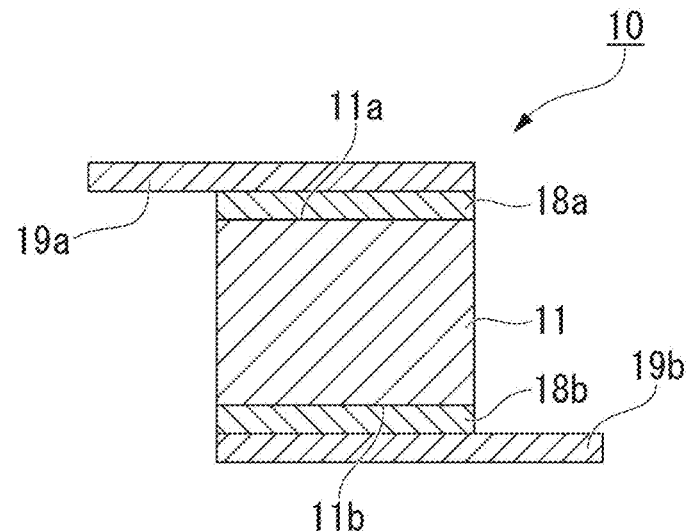
FIG. 1 is a cross-sectional view showing a thermoelectric conversion material that is an embodiment of the present invention and a thermoelectric conversion element in which the thermoelectric conversion material is used.

FIG. 1 shows a magnesium-based thermoelectric conversion material 11 that is an embodiment of the present invention and a magnesium-based thermoelectric conversion element 10 in which the magnesium-based thermoelectric conversion material 11 is used.

The magnesium-based thermoelectric conversion element 10 includes the magnesium-based thermoelectric conversion material 11 that is the present embodiment, metallized layers 18a, 18b formed on one surface 11a and another surface 11b facing the above-described face of the magnesium-based thermoelectric conversion material 11, and electrodes 19a, 19b laminated on the metallized layers 18a, 18b.

For the metallized layers 18a, 18b, nickel, silver, cobalt, tungsten, molybdenum, or the like is used. The metallized layers 18a, 18b can be formed by electric sintering, plating, electrodeposition, or the like.

The electrodes 19a, 19b are formed of a metallic material having excellent electrical conductivity, for example, a plate material of copper, aluminum, or the like. In the present embodiment, an aluminum-rolled plate is used. In addition, the thermoelectric conversion material 11 (the metallized layers 18a, 18b) and the electrodes 19a, 19b can be bonded together by Ag brazing, Ag plating, or the like.

In addition, the magnesium-based thermoelectric conversion material 11 is regarded as a sintered compact of a magnesium compound, and, in the present embodiment, regarded as magnesium silicide ($Mg_2Si$) to which antimony (Sb) is added as a dopant. For example, the magnesium-based thermoelectric conversion material 11 of the present embodiment has a composition in which antimony is included in $Mg_2Si$ in a range of 0.1 at % or more and 2.0 at % or less. In the magnesium-based thermoelectric conversion material 11 of the present embodiment, an n-type thermoelectric conversion material having a high carrier density is produced by adding antimony that is a pentavalent donor.

As a material configuring the thermoelectric conversion material 11, it is also possible to use a compound obtained by adding a different element to magnesium silicide such as $Mg_2Si_{1-x}Ge_x$ or $Mg_2Si_{1-y}Sn_y$ in the same manner. In these formulas, x is in a range satisfying a relationship of $0<x<1$, and y is in a range satisfying a relationship of $0<y<1$.

In addition, as the donor for producing the magnesium-based thermoelectric conversion material 11 as an n-type thermoelectric conversion element, it is possible to use, in addition to antimony (Sb), bismuth (Bi), aluminum (Al), phosphorus (P), arsenic (As), or the like.

In addition, the magnesium-based thermoelectric conversion material 11 may be a p-type thermoelectric conversion element, and, in this case, the p-type thermoelectric conversion element can be obtained by adding a dopant such as lithium (Li) or silver (Ag) as an acceptor.

Figure 2:
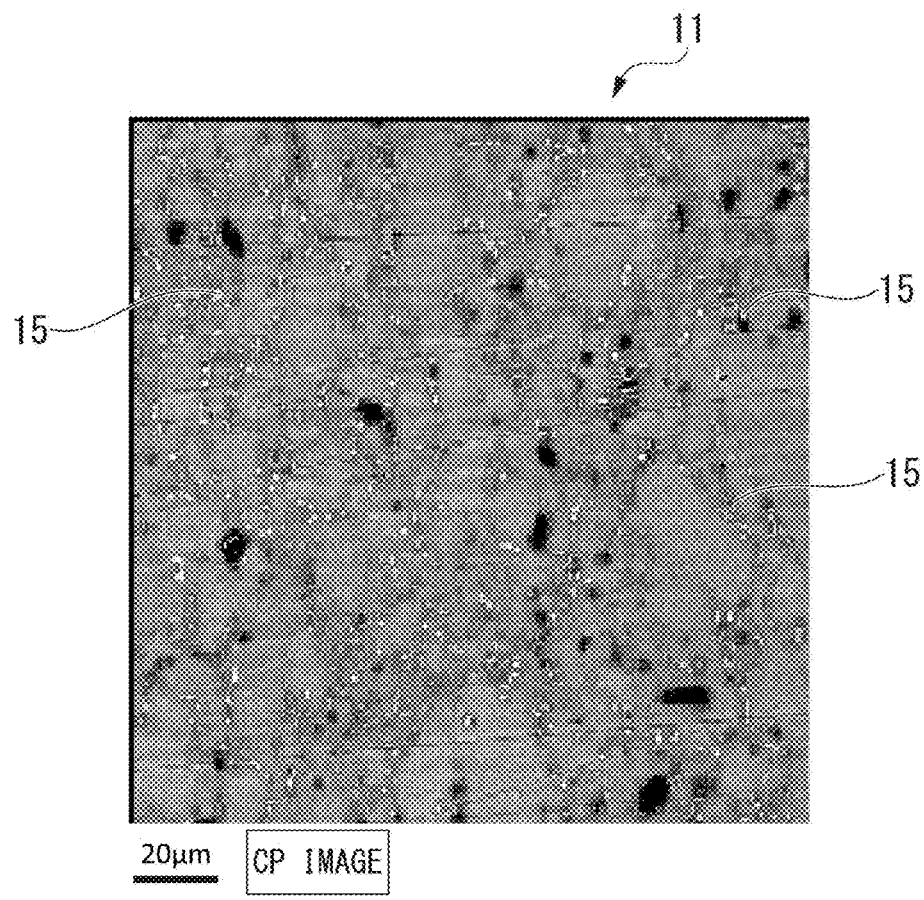
FIG. 2 is a view showing a cross-sectional observation result of the thermoelectric conversion material that is the embodiment of the present invention.

In addition, in the magnesium-based thermoelectric conversion material 11 that is the present embodiment, as shown in FIG. 2, in a cross section of the sintered compact, mainly, a Si-rich metallic phase 15 having a higher Si concentration than in magnesium compound grains is unevenly distributed in the crystal grain boundaries of the magnesium compound (magnesium silicide).

Here, in the cross section of the sintered compact, the area ratio of the Si-rich metallic phase 15 is set in a range of 2.5% or more and 10% or less.

Furthermore, the number density of the Si-rich metallic phase 15 having an area of 1 $\mu m^2$ or more is set in a range of 1,800/$mm^2$ or more and 14,000/$mm^2$ or less.

In the magnesium-based thermoelectric conversion material 11 made of the sintered compact of the magnesium compound (magnesium silicide), MgO is present in the crystal grain boundaries of the magnesium compound (magnesium silicide). MgO has a low electrical conductivity, and thus the electric resistance of the crystal grain boundaries becomes high.

In the magnesium-based thermoelectric conversion material 11 that is the present embodiment, as described above, the Si-rich metallic phase 15 is unevenly distributed in the crystal grain boundaries of the magnesium compound (magnesium silicide), and thus it becomes possible to decrease the electric resistance of the crystal grain boundaries.

The thermal conductivity of Si is 168 W/(m·K) at room temperature, and the thermal conductivity of magnesium silicide ($Mg_2Si$) is 9 W/(m·K) at room temperature. Therefore, when the content of Si becomes great, the thermal conductivity of the magnesium-based thermoelectric conversion material 11 becomes high, the temperature difference between one end side and the other end side of the magnesium-based thermoelectric conversion material 11 becomes small, and there is a concern that the thermoelectric conversion efficiency may decrease.

Here, when the area ratio of the Si-rich metallic phase 15 is less than 2.5%, there is a concern that it may not be possible to sufficiently decrease the electric resistance of the crystal grain boundaries.

On the other hand, when the area ratio of the Si-rich metallic phase 15 exceeds 10%, the content of Si becomes great, and there is a concern that the thermal conductivity of the magnesium-based thermoelectric conversion material 11 may become high.

On the basis of what has been described above, in the present embodiment, the area ratio of the Si-rich metallic phase 15 is defined to be in a range of 2.5% or more and 10% or less.

The lower limit of the area ratio of the Si-rich metallic phase 15 is preferably set to 3.5% or more and more preferably set to 4.5% or more. In addition, the upper limit of the area ratio of the Si-rich metallic phase 15 is preferably set to 9% or less and more preferably set to 8% or less.

In addition, when the number density of the Si-rich metallic phase 15 having an area of 1 µm² or more is less than 1,800/mm², there is a concern that it may not be possible to sufficiently decrease the electric resistance of the crystal grain boundaries.

On the other hand, when the number density of the Si-rich metallic phase 15 having an area of 1 µm² or more exceeds 14,000/mm², the content of Si becomes great, and there is a concern that the thermal conductivity of the magnesium-based thermoelectric conversion material 11 may become high.

On the basis of what has been described above, in the present embodiment, the number density of the Si-rich metallic phase 15 having an area of 1 µm² or more is set in a range of 1,800/mm² or more and 14,000/mm² or less.

The lower limit of the number density of the Si-rich metallic phase 15 having an area of 1 µm² or more is preferably set to 2,500/mm² or more and more preferably set to 5,000/mm² or more. In addition, the upper limit of the number density of the Si-rich metallic phase 15 having an area of 1 µm² or more is preferably set to 12,500/mm² or less and more preferably set to 10,000/mm² or less.

In addition, the Si-rich metallic phase 15 preferably contains an extremely small amount of Sb, Al, and the like. When the Si-rich metallic phase 15 unevenly distributed in the crystal grain boundaries of the magnesium compound (magnesium silicide) contains an extremely small amount of Sb, Al, and the like, the electric resistance of the crystal grain boundaries further decreases due to the dopant effect of these elements. In the present embodiment, an extremely small amount of Sb included in the magnesium compound (magnesium silicide) is included in the Si-rich metallic phase 15.

The extremely small amount mentioned herein means to be 0.005 at % to 0.1 at %.

Figure 3:
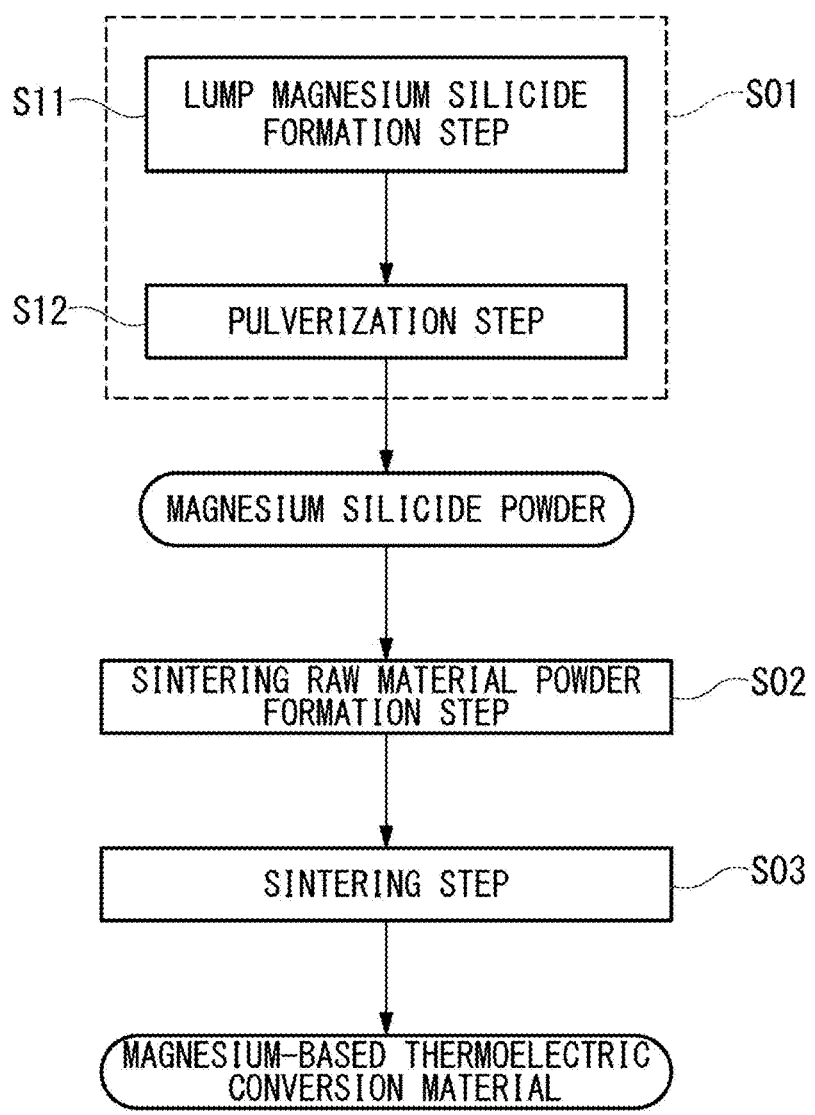
FIG. 3 is a flowchart of a method for producing the thermoelectric conversion material that is the embodiment of the present invention.

Hereinafter, a method for producing the magnesium-based thermoelectric conversion material 11 that is the present embodiment will be described with reference to FIG. 3 and FIG. 4.

(Magnesium Silicide Powder Preparation Step S01)

First, powder of magnesium silicide ($Mg_2Si$) that serves as the matrix of the sintered compact that is the magnesium-based thermoelectric conversion material 11 is produced.

In the present embodiment, a magnesium silicide powder preparation step S01 includes a lump magnesium silicide formation step S11 of obtaining lump magnesium silicide and a pulverization step S12 of pulverizing the lump magnesium silicide ($Mg_2Si$ to produce powder.

In the lump magnesium silicide formation step S11, silicon powder, magnesium powder, and a dopant are respectively weighed and mixed together. For example, in the case of forming an n-type thermoelectric conversion material, a pentavalent material such as antimony or bismuth or aluminum is mixed as the dopant, and, in the case of forming a p-type thermoelectric conversion material, a material such as lithium or silver is mixed as the dopant. In the present embodiment, antimony was used as the dopant for obtaining an n-type thermoelectric conversion material, and the amount added was set in a range of 0.1 at % or more and 2.0 at % or less.

In addition, this powder mixture is introduced to, for example, an alumina crucible, heated up to a range of 800° C. or more and 1,150° C. or less, and cooled to be solidified. Therefore, for example, lump magnesium silicide is obtained.

Since a small amount of magnesium sublimates during the heating, the amount of magnesium added during the weighing of the raw materials is preferably larger than the stoichiometric composition (Mg:Si) of 2:1 by, for example, approximately 5 at %.

In the pulverization step S12, the obtained lump magnesium silicide is pulverized using a pulverizer, thereby forming magnesium silicide powder. The pulverization is preferably carried out in inert gas, for example, Ar.

Here, the average grain diameter of the magnesium silicide powder is preferably set in a range of 0.5 µm or more and 100 µm or less.

In the case of using commercially available magnesium silicide powder or magnesium silicide powder to which a dopant is added, it is also possible to omit the lump magnesium silicide formation step S11 and the pulverization step S12.

(Sintering Raw Material Powder Formation Step S02)

Next, a silicon oxide is mixed into the obtained magnesium silicide powder, thereby obtaining sintering raw material powder.

As the silicon oxide, it is possible to use $SiO_x$ (x=1 to 2) such as amorphous $SiO_2$, cristobalite, quartz, tridymite, coesite, stishovite, seifertite, or shocked quartz.

The amount of the silicon oxide mixed is in a range of 0.5 mol % or more and 13.0 mol % or less. The amount is more preferably set to 0.7 mol % or more and 7.0 mol % or less. The silicon oxide preferably has a powder form having a grain diameter of 0.5 µm or more and 100 µm or less. In the present embodiment, $SiO_2$ powder having a central grain diameter of 20 µm is used as the silicon oxide.

(Sintering Step S03)

Next, the sintering raw material powder obtained as described above is heated while being pressurized, thereby obtaining a sintered compact.

Figure 4:
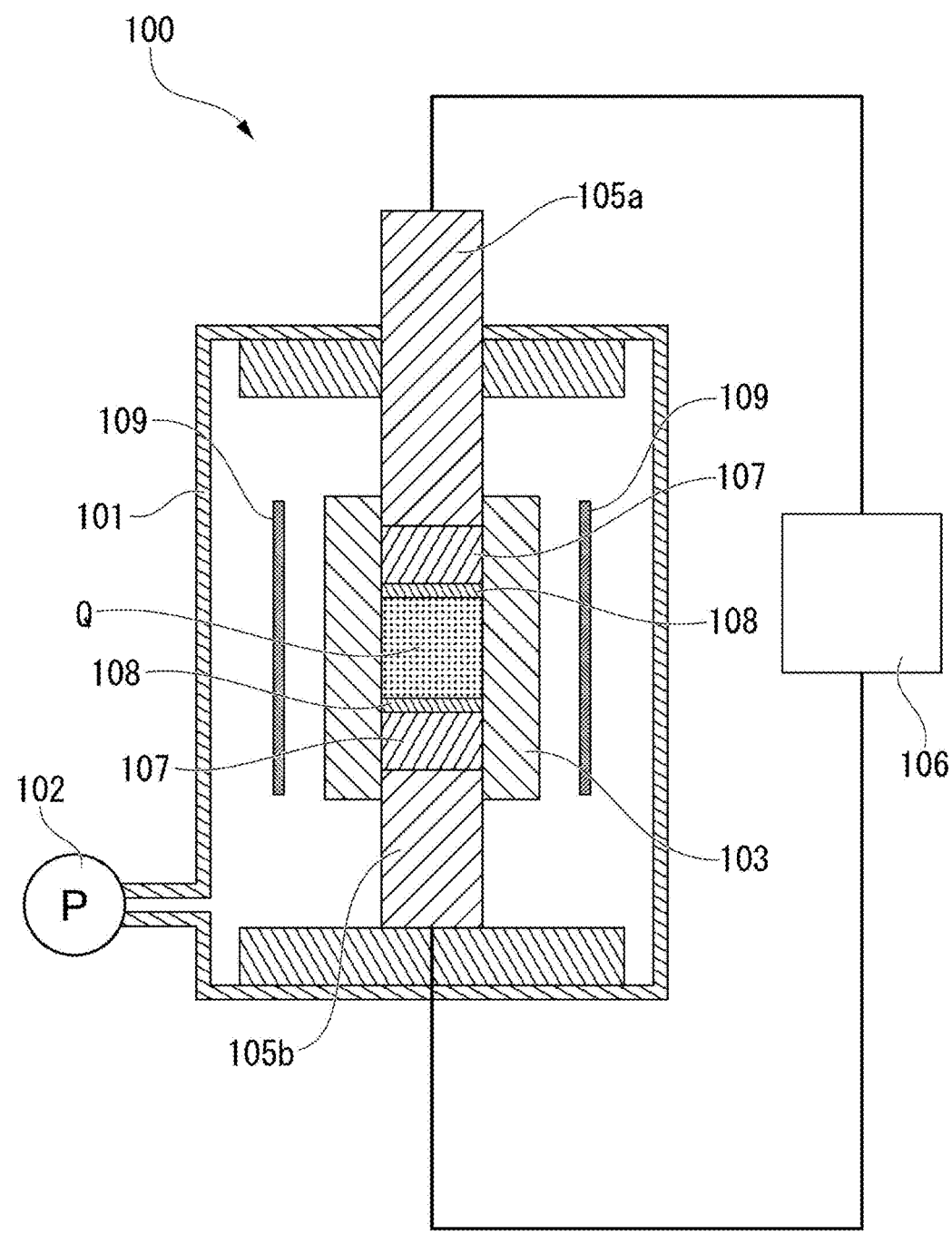
FIG. 4 is a cross-sectional view showing an example of a sintering device that is used in the method for producing the thermoelectric conversion material that is the embodiment of the present invention.

In the present embodiment, in the sintering step S03, a sintering device (electric sintering device 100) shown in FIG. 4 is used.

The sintering device (electric sintering device 100) shown in FIG. 4 includes, for example, a pressure-resistant housing 101, a vacuum pump 102 that depressurizes the inside of the pressure-resistant housing 101, a hollow tubular carbon mold 103 disposed in the pressure-resistant housing 101, a pair of electrode portions 105a, 105b that pressurize a sintering raw material powder Q filled into the carbon mold 103 and apply a current, and a power supply device 106 that applies voltage between the pair of electrode portions 105a, 105b. In addition, a carbon plate 107 and a carbon sheet 108 are respectively disposed between the electrode portions 105a, 105b and the sintering raw material powder Q. Additionally, the sintering device has a thermometer, a displacement meter, not shown, or the like.

In addition, in the present embodiment, a heater 109 is disposed on the outer circumferential side of the carbon mold 103. The heater 109 is disposed on four side surfaces so as to cover the entire outer circumferential side surface of the carbon mold 103. As the heater 109, it is possible to use a carbon heater, a nichrome wire heater, a molybdenum heater, a kanthal wire heater, a high-frequency heater, or the like.

In the sintering step S03, first, the sintering raw material powder Q is filled into the carbon mold 103 of the electric sintering device 100 shown in FIG. 4. The inside of the carbon mold 103 is covered with, for example, a graphite sheet or a carbon sheet. In addition, a direct current is caused to flow between the pair of electrode portions 105a, 105b using the power supply device 106 and to flow the current into the sintering raw material powder Q, thereby increasing the temperature by self heating (electric heating). In addition, between the pair of electrode portions 105a, 105b, the movable electrode portion 105a is moved toward the sintering raw material powder Q, thereby pressurizing the sintering raw material powder Q between the movable electrode portion 105a and the fixed electrode portion 105b at a predetermined pressure. In addition, the heater 109 is heated.

Therefore, the sintering raw material powder Q is sintered by the self heating of the sintering raw material powder Q, heat from the heater 109, and pressurization.

In the present embodiment, regarding sintering conditions in the sintering step S03, the sintering temperature of the sintering raw material powder Q is set in a range of 800° C. or more and 1,020° C. or less, and the holding time at this sintering temperature is set in a range of 0.15 minutes or more and 5 minutes or less. In addition, the pressurization load is set in a range of 20 MPa or more and 50 MPa or less.

In addition, the atmosphere in the pressure-resistant housing 101 is preferably set to an inert atmosphere such as an argon atmosphere or a vacuum atmosphere. In the case of setting the atmosphere to a vacuum atmosphere, the pressure is preferably set to 5 Pa or less.

Here, in a case where the sintering temperature of the sintering raw material powder Q is lower than 800° C., it is not possible to sufficiently remove an oxide film formed on the surface of each powder of the sintering raw material powder Q, the oxide film remains in the crystal grain boundaries, and the density of the sintered compact becomes low. Therefore, there is a concern that the resistance of the obtained thermoelectric conversion material may become high.

On the other hand, in a case where the sintering temperature of the sintering raw material powder Q exceeds 1,020° C., the decomposition of magnesium silicide progresses within a short period of time, a compositional deviation is caused, the resistance increases, and there is a concern that the Seebeck coefficient may decrease.

Therefore, in the present embodiment, the sintering temperature in the sintering step S03 is set in a range of 800° C. or more and 1,020° C. or less.

The lower limit of the sintering temperature in the sintering step S03 is preferably set to 850° C. or more and more preferably set to 900° C. or more. On the other hand, the upper limit of the sintering temperature in the sintering step S03 is preferably set to 1,000° C. or lower and more preferably set to 980° C. or lower.

In addition, in a case where the holding time at the sintering temperature is shorter than 0.15 minutes, the sintering becomes insufficient, and there is a concern that the resistance of the obtained thermoelectric conversion material may become high.

On the other hand, in a case where the holding time at the sintering temperature exceeds 5 minutes, the decomposition of magnesium silicide progresses, a compositional deviation is caused, the resistance increases, and there is a concern that the Seebeck coefficient may decrease.

Therefore, in the present embodiment, the holding time at the sintering temperature in the sintering step S03 is set in a range of 0.15 minutes or more and 5 minutes or less.

The lower limit of the holding time at the sintering temperature in the sintering step S03 is preferably set to 0.15 minutes or longer and more preferably set to 0.5 minutes or more. On the other hand, the upper limit of the holding time at the sintering temperature in the sintering step S03 is preferably set to 5 minutes or less and more preferably set to 3 minutes or less.

Furthermore, in a case where the pressurization load in the sintering step S03 is less than 20 MPa, the density does not become high, and there is a concern that the resistance of the thermoelectric conversion material may become high.

On the other hand, in a case where the pressurization load in the sintering step S03 exceeds 50 MPa, there is a concern that the service life of the carbon mold that is used for the production of the sintered compact may become short or the carbon mold may break depending on cases.

Therefore, in the present embodiment, the pressurization load in the sintering step S03 is set in a range of 20 MPa or more and 50 MPa or less.

The lower limit of the pressurization load in the sintering step S03 is preferably set to 20 MPa or more and more preferably set to 25 MPa or more. On the other hand, the upper limit of the pressurization load in the sintering step S03 is preferably set to 50 MPa or less and more preferably set to 40 MPa or less.

In addition, in the sintering step S03, the polarities of one electrode portion 105a and the other electrode portion 105b are switched at predetermined time intervals at the time of causing the direct current to flow into the sintering raw material powder Q. That is, a state in which energization is carried out with the one electrode portion 105a set as a positive electrode and the other electrode portion 105b set as a negative electrode and a state in which energization is carried out with the one electrode portion 105a set as a negative electrode and the other electrode portion 105b set as a positive electrode are alternately carried out. In the present embodiment, the predetermined time intervals are set in a range of 10 seconds or longer and 300 seconds or shorter. This is because, when the predetermined time intervals are shorter than 10 seconds, an increase in the temperature of the sintering raw material powder Q within the predetermined time interval is small, and an effect of the switching of the polarities is weak; on the other hand, in a case where the predetermined time intervals are longer than 300 seconds, an increase in the temperature of the sintering raw material powder Q within the predetermined time interval is great, an effect of one polarity becomes strong, and there is a concern that it may not become possible to sufficiently obtain uniformity.

The magnesium-based thermoelectric conversion material 11 that is the present embodiment is produced through the above-described steps.

According to the magnesium-based thermoelectric conversion material 11 that is the present embodiment provided with a configuration as described above, the Si-rich metallic phase 15 having a higher Si concentration than in the magnesium compound grains is unevenly distributed in the crystal grain boundaries of the magnesium compound, and thus the electric resistance of the crystal grain boundaries becomes low. Therefore, it becomes possible to improve the thermoelectric conversion efficiency of the magnesium-based thermoelectric conversion material 11.

In addition, the area ratio of the Si-rich metallic phase 15 is set in a range of 2.5% or more and 10% or less, and the number density of the Si-rich metallic phase 15 having an area of 1 $\mu m^2$ or more is set in a range of 1,800/$mm^2$ or more and 14,000/$mm^2$ or less, and thus the Si-rich metallic phase 15 having a relatively high electrical conductivity is uniformly and sufficiently dispersed, and it becomes possible to improve the thermoelectric conversion efficiency of the magnesium-based thermoelectric conversion material 11.

According to the method for producing the magnesium-based thermoelectric conversion material 11 that is the present embodiment, in the sintering step S03, a electric heating method in which the sintering raw material powder Q is energized while being pressurized using the pair of electrode portions 105a, 105b is used, and the polarities of the pair of electrode portions 105a, 105b are switched at the predetermined time intervals during the sintering, and thus the sintered compact is uniformly sintered.

In addition, in the present embodiment, the sintering raw material powder Q is also heated from the outer circumferential side using the heater 109 disposed on the outer circumferential side of the sintering raw material powder Q, and thus it is possible to more uniformly heat the sintering raw material.

Therefore, it is possible to disperse the Si-rich metallic phase 15 having a higher Si concentration than in the magnesium compound grains throughout the entire sintered compact, and it is possible to obtain the magnesium-based thermoelectric conversion material 11 having an excellent thermoelectric conversion efficiency.

Hitherto, the embodiment of the present invention has been described, but the present invention is not limited thereto, and the embodiment can be appropriately modified within the scope of the technical concept of the present invention.

For example, in the present embodiment, the magnesium-based thermoelectric conversion element having the structure as shown in FIG. 1 has been described, but the magnesium-based thermoelectric conversion element is not limited thereto, and the structure, disposition, and the like of the metallized layer or the electrode are not particularly limited as long as the magnesium-based thermoelectric conversion material of the present invention is used.

Furthermore, in the present embodiment, as the sintering raw material, the use of the powder of magnesium silicide to which antimony (Sb) is added as the dopant has been described, but the sintering raw material is not limited thereto and may be, for example, a material including at least one selected from the group consisting of Li, Na, K, B, Al, Ga, In, N, P, As, Bi, Ag, Cu, and Y as the dopant or a material including these element in addition to Sb.

In addition, in the present embodiment, magnesium silicide (Mg2Si) has been described as an example of the magnesium compound, but the magnesium compound is not limited thereto and may be any of $Mg_2Si_{1-x}Ge_x$, and $Mg_2Si_{1-y}Sn_y$. In these formulas, x is in a range satisfying a relationship of 0<x<1, and y is in a range satisfying a relationship of 0<y<1.

EXAMPLES

Hereinafter, the results of experiments carried out to confirm the effect of the present invention will be described.

Mg having a purity of 99.9 mass % (manufactured by Kojundo Chemical Laboratory Co., Ltd., average grain diameter: 180 μm), Si having a purity of 99.99 mass % (manufactured by Kojundo Chemical Laboratory Co., Ltd., average grain diameter: 300 μm), and Sb having a purity of 99.9 mass % (manufactured by Kojundo Chemical Laboratory Co., Ltd., average grain diameter: 300 μm) were respectively weighed. These powders were well mixed together in a mortar, put into an alumina crucible, and heated at 850° C. for two hours in Ar-5 vol % $H_2$. In consideration of the deviation from the stoichiometric composition (Mg:Si) of 2:1 due to the sublimation of Mg, Mg was mixed larger than the stoichiometric composition (Mg:Si) of 2:1 by 5 at %. Therefore, lump magnesium silicide ($Mg_2Si$) containing 1 at % of Sb that was a dopant was obtained.

Next, this lump magnesium silicide ($Mg_2Si$) was finely pulverized in the mortar and classified, thereby obtaining magnesium silicide ($Mg_2Si$) powder having an average grain diameter of 30 μm.

In addition, the magnesium silicide powder and silicon oxide powder ($SiO_2$ powder manufactured by Tatsumori Ltd., average grain diameter: 20 μm) were mixed together, thereby obtaining sintering raw material powder.

The obtained sintering raw material powder was filled into a carbon mold inside of which was covered with a carbon sheet. In addition, electric sintering was carried out under conditions shown in Table 1 using a sintering device (electric sintering device 100) shown in FIG. 4.

For the obtained thermoelectric conversion material, the area ratio of a Si-rich metallic phase, the number density of the Si-rich metallic phase having an area of 1 $μm^2$ or more, and the thermoelectric characteristic were evaluated in the following order.

(Area Ratio and Number Density of Si-Rich Metallic Phase)

A measurement specimen was sampled, a cross-sectional surface was polished, and EPMA observation was carried out using an EPMA device (JXA-8800RL manufactured by JEOL Ltd.) under conditions of an accelerated voltage of 15 kV, a beam current of 50 nA, a beam diameter of 1 μm, and the number of mapping measurement points of 200×200 pixels.

In an EPMA analysis, element information (element concentration) in a region wider than the primary beam diameter is detected by the spreading of an electron beam in the measurement specimen. In the case of a light element such as Si, the element information (element concentration) is detected from 3 μmφ that is triple the beam diameter. Therefore, when the size of a detection subject is small at the time of carrying out mapping, concentration information of not only the detection subject but also an element around the detection subject is also detected together, and an average value thereof is regarded as the concentration. Therefore, in the present invention, the Si-rich metallic phase was regarded as a region in which the Si concentration was higher than the average Si concentration in the magnesium silicide grains by 2 wt % or more.

Figure 5A:
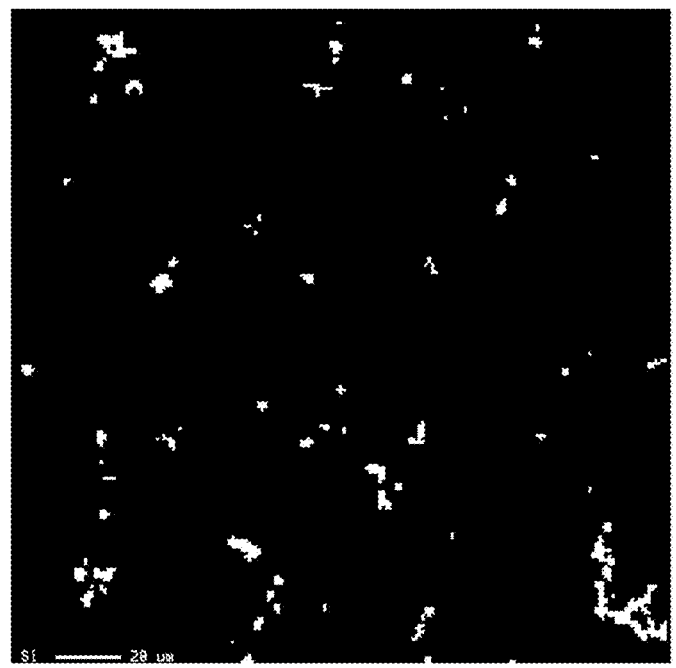
FIG. 5A is a photograph exemplifying an EPMA observation result of a cross section of a magnesium-based thermoelectric conversion material in an example.
Figure 5B:
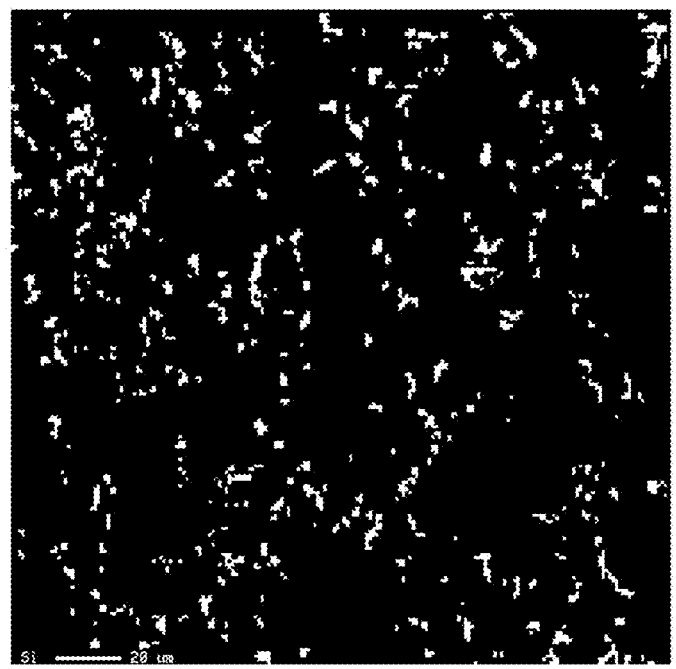
FIG. 5B is a photograph exemplifying the EPMA observation result of the cross section of the magnesium-based thermoelectric conversion material in the example.

FIG. 5A and FIG. 5B show an example of an EPMA observation result. In FIG. 5A and FIG. 5B, a phase having a high silicon concentration that was higher than the average Si concentration in the magnesium silicide grains by 2 wt % or more is shown white, and the area ratio of the Si-rich metallic phase was measured. Here, the area ratio (%) of the Si-rich metallic phase was defined as (the area of the Si-rich metallic phase)/(the area of one view of EPMA mapping).

In addition, on the basis of a mapping diagram as shown in FIG. 5A and FIG. 5B, the number density of the Si-rich metallic phase having an area of 1 $μm^2$ or more was measured. In the measurement of the number, one continuous phase was measured as one Si-rich metallic phase regardless of the size.

In addition, in the specimen observed by the EPMA observation, an Auger electron spectroscopy analysis was carried out on a place including a region having a high Si concentration, and the region having a high Si concentration was confirmed to be a Si metallic phase. An Auger analyzer (PHI700Xi manufactured by Ulvac-Phi, Inc.) was used, as observation conditions, an accelerated voltage was set to 10 kV, and a beam current was set to 15 nA, a beam diameter was set to 15 nm, and, as etching conditions, an ion kind was set to $Ar^+$, an accelerated voltage was set to 500 V, a beam current was set to 2.7 nA, an etching time was set to 10 minutes, the degree of vacuum near an ion gun was set to 10 mPa, and the pressure in an analysis chamber was set to $10^{-9}$ Torr.

Figure 6:
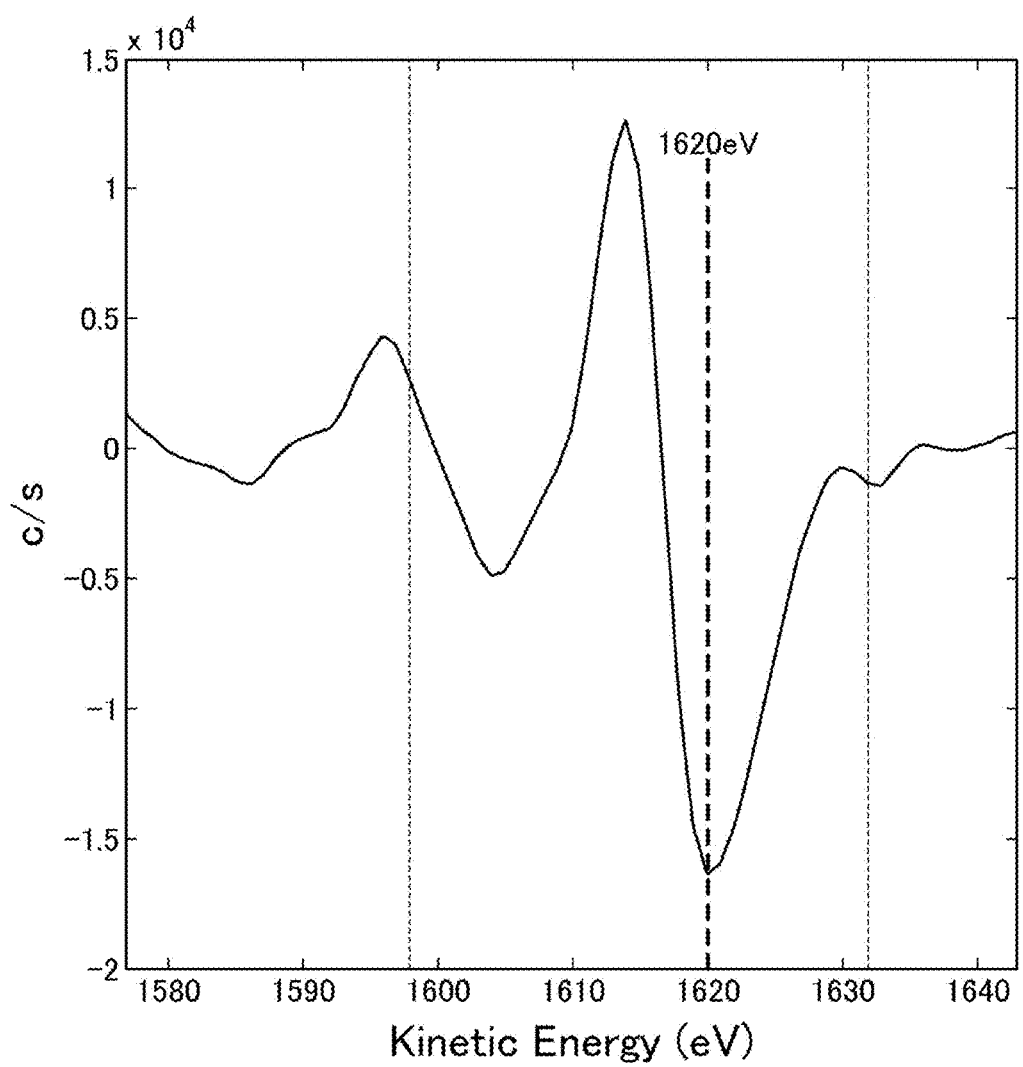
FIG. 6 is a view showing an Auger electron spectroscopy analysis result of a Si-rich metallic phase in the example.

As a result, as shown in FIG. 6, a peak was observed at 1,620 eV indicating the Si metallic phase, and thus it was confirmed that the region having a high Si concentration observed by the EPMA observation was a Si metallic phase.

(Thermoelectric Characteristic)

Regarding the thermoelectric characteristic, 4 mm×4 mm×15 mm cuboids were cut out from the sintered thermoelectric conversion material, and the power factors (PF) of the respective specimens at 550° C. were obtained using a thermoelectric characteristic evaluator (ZEM-3 manufactured by Advance Riko, Inc.).

INDUSTRIAL APPLICABILITY

According to the present invention, it is possible to provide a thermoelectric conversion element having a higher thermoelectric conversion efficiency and thus more effectively use heat waste.

REFERENCE SIGNS LIST

10 MAGNESIUM-BASED THERMOELECTRIC CONVERSION ELEMENT
11 MAGNESIUM-BASED THERMOELECTRIC CONVERSION MATERIAL
15 Si-RICH METALLIC PHASE
19a, 19b ELECTRODE

TABLE 1

| | Amount of SiO$_2$ added (mass %) | Pressurization pressure (MPa) | Maximum temperature (° C.) | Time intervals of polarity switch (seconds) | Presence or absence of heater on outer circumferential side | Si-rich metallic phase Area ratio (%) | Number density (/mm$^2$) | Power factor at 550° C. (×10$^{-4}$ W/m · K$^2$) |
|---|---|---|---|---|---|---|---|---|
| Invention Example 1 | 0.5 | 40 | 900 | 60 | Present | 2.7 | 1850 | 3.02 |
| Invention Example 2 | 1.0 | 40 | 900 | 120 | Present | 5.9 | 8000 | 5.25 |
| Invention Example 3 | 2.0 | 40 | 900 | 120 | Present | 6.4 | 9775 | 4.92 |
| Invention Example 4 | 3.0 | 40 | 900 | 120 | Present | 8.4 | 11175 | 4.12 |
| Invention Example 5 | 3.0 | 40 | 900 | 300 | Present | 9.6 | 13700 | 3.45 |
| Invention Example 6 | 2.0 | 40 | 850 | 300 | Absent | 6.1 | 8391 | 4.46 |
| Comparative Example 1 | 0.3 | 40 | 900 | — | Present | 2.1 | 1725 | 2.39 |
| Comparative Example 2 | 0.2 | 40 | 870 | 120 | Absent | 1.5 | 1225 | 2.13 |
| Comparative Example 3 | 5.0 | 40 | 900 | 120 | Present | 12.4 | 14575 | 2.57 |

In Comparative Examples 1 and 2 in which the area ratio of the Si-rich metallic phase was set to less than 2.5% and the number density of the Si-rich metallic phase having an area of 1 µm$^2$ or more was set to less than 1,800/mm$^2$, the power factors at 550° C. became low. It is assumed to be because a decrease in the electric resistance of the crystal grain boundaries did not make sufficient contribution.

In Comparative Example 3 in which the area ratio of the Si-rich metallic phase exceeded 10% and the number density of the Si-rich metallic phase having an area of 1 µm$^2$ or more exceeded 14,000/mm$^2$, the power factors at 550° C. became low. This is assumed to be because the content of MgSiO that was denatured SiO$_2$ and the content of Si became great, the thermal conductivity became high, and the Seebeck coefficient became small.

In contrast, in Invention Examples 1 to 6 in which the area ratio of the Si-rich metallic phase was set in a range of 2.5% or more and 10% or less, and the number density of the Si-rich metallic phase having an area of 1 µm$^2$ or more was set in a range of 1,800/mm$^2$ or more and 14,000/mm$^2$ or less, the power factors at 550° C. became high.

Based on the above-described results, it was confirmed that, according to the invention examples, it is possible to provide a thermoelectric conversion material having an excellent thermoelectric characteristic.

The invention claimed is:

1. A magnesium-based thermoelectric conversion material made of a sintered compact of a magnesium compound,
   wherein, in a cross section of the sintered compact, magnesium oxide and a Si-rich metallic phase that has a higher Si concentration than in magnesium compound grains are unevenly distributed in a crystal grain boundary between the magnesium compound grains,
   an area ratio of the Si-rich metallic phase is in a range of 2.5% or more and 10% or less,
   a number density of the Si-rich metallic phase having an area of 1 µm$^2$ or more is in a range of 1,800/mm$^2$ or more and 14,000/mm$^2$ or less,
   the number density of the Si-rich metallic phase having an area of 1 µm$^2$ or more is measured on the basis of a mapping diagram obtained by an EPMA device, and
   the magnesium compound grain comprises at least one selected from the group consisting of Li, Na, K, B, Al, Ga, In, N, P, As, Sb, Bi, Ag, Cu, and Y as a dopant.

2. The magnesium-based thermoelectric conversion material according to claim 1,
   wherein the magnesium compound is any of Mg$_2$Si, Mg$_2$Si$_{1-x}$Ge$_x$, and Mg$_2$Si$_{1-y}$Sn$_y$,
   wherein:
   x is in a range satisfying a relationship of 0<x<1, and
   y is in a range satisfying a relationship of 0<y<1.

3. A magnesium-based thermoelectric conversion element comprising:

the magnesium-based thermoelectric conversion material according to claim 1; and electrodes respectively bonded to a surface and another surface opposite to the surface of the magnesium-based thermoelectric conversion material.

4. A magnesium-based thermoelectric conversion element comprising:

the magnesium-based thermoelectric conversion material according to claim 2; and electrodes respectively bonded to a surface and another surface opposite to the surface of the magnesium-based thermoelectric conversion material.

5. The magnesium-based thermoelectric conversion material according to claim 1, wherein a power factor of the magnesium-based thermoelectric conversion material is in the range of $3.02 \times 10^{-4}$ W/m·K$^2$ or more and $5.25 \times 10^4$ W/m·K$^2$ or less.

6. The magnesium-based thermoelectric conversion material according to claim 1, wherein the Si included in the Si-rich metallic phase is obtained by removing oxygen from silicon oxide having a grain diameter of 0.5 μm or more and 100 μm or less.

7. The magnesium-based thermoelectric conversion material according to claim 1, is made by sintering a raw material powder with a temperature in a range of 800° C. or more and 1,020° C. or less, wherein the raw material powder is obtained by mixing a silicon oxide into a magnesium silicide powder.

8. The magnesium-based thermoelectric conversion material according to claim 1, wherein the number density of the Si-rich metallic phase having an area of 1 μm$^2$ or more is in a range of 2,500/mm$^2$ or more and 12,500/mm$^2$ or less.

9. The magnesium-based thermoelectric conversion material according to claim 1, wherein the Si-rich metallic phase contains at least one of Sb and Al in a range of 0.005 at % to 0.1 at %.

10. The magnesium-based thermoelectric conversion material according to claim 1, wherein the magnesium oxide is MgO.

\* \* \* \* \*